(12) United States Patent
Bottoni et al.

(10) Patent No.: US 10,206,046 B2
(45) Date of Patent: Feb. 12, 2019

(54) CIRCUIT BOARD MODULE COMPRISING A CONTINUOUS CAVITY, ASSOCIATED SONIC TRANSDUCER ASSEMBLY, AND PRODUCTION METHOD

(71) Applicant: USOUND GMBH, Graz (AT)

(72) Inventors: Ferruccio Bottoni, Graz (AT); Andrea Rusconi Clerici Beltrami, Vienna (AT)

(73) Assignee: USOUND GMBH, Graz (AT)

( * ) Notice: Subject to any disclaimer, the term of this patent is extended or adjusted under 35 U.S.C. 154(b) by 0 days.

(21) Appl. No.: 15/573,210

(22) PCT Filed: May 10, 2016

(86) PCT No.: PCT/EP2016/060479
§ 371 (c)(1),
(2) Date: Nov. 10, 2017

(87) PCT Pub. No.: WO2016/180841
PCT Pub. Date: Nov. 17, 2016

(65) Prior Publication Data
US 2018/0091905 A1    Mar. 29, 2018

(30) Foreign Application Priority Data
May 13, 2015    (DE) .................... 10 2015 107 557

(51) Int. Cl.
*H04R 3/00*    (2006.01)
*H04R 19/02*    (2006.01)
(Continued)

(52) U.S. Cl.
CPC ........... *H04R 19/02* (2013.01); *B81B 3/0021* (2013.01); *B81B 7/007* (2013.01); *B81B 7/0058* (2013.01);
(Continued)

(58) Field of Classification Search
CPC ....................................................... H04R 3/00
See application file for complete search history.

(56) References Cited

U.S. PATENT DOCUMENTS

| 3,701,865 A | 10/1972 | Carlson et al. |
| 5,870,482 A | 2/1999 | Loeppert et al. |

(Continued)

FOREIGN PATENT DOCUMENTS

| DE | 42 29 244 | 3/1994 |
| DE | 102005053767 A1 | 5/2007 |

(Continued)

OTHER PUBLICATIONS

International Search Report (PCT/EP2016/060479), dated Sep. 29, 2016.

(Continued)

*Primary Examiner* — Olisa Anwah
(74) *Attorney, Agent, or Firm* — Dority & Manning, P.A.

(57) ABSTRACT

A circuit board module for a sound transducer assembly for generating and/or detecting sound waves in the audible wavelength spectrum includes a circuit board, which features a recess with a first opening. At least a part of a MEMS sound transducer is arranged in the area of the first opening, such that the recess at least partially forms a cavity of the MEMS sound transducer. The recess features a second opening opposite to the first opening, such that the recess extends completely through the circuit board. A sound transducer assembly includes such a circuit board.

20 Claims, 4 Drawing Sheets

(51) Int. Cl.
  *B81B 7/00* (2006.01)
  *H04R 1/28* (2006.01)
  *H04R 31/00* (2006.01)
  *B81B 3/00* (2006.01)
  *H04R 19/04* (2006.01)
  *B81C 3/00* (2006.01)
  *B81C 99/00* (2010.01)

(52) U.S. Cl.
  CPC .......... *B81B 7/0061* (2013.01); *B81C 99/004* (2013.01); *H04R 1/2811* (2013.01); *H04R 3/00* (2013.01); *H04R 19/04* (2013.01); *H04R 31/006* (2013.01); *B81B 2201/0257* (2013.01); *B81B 2203/0127* (2013.01); *B81B 2203/0315* (2013.01); *B81B 2207/012* (2013.01); *B81B 2207/097* (2013.01); *B81C 3/001* (2013.01); *B81C 99/0025* (2013.01); *H04R 2201/003* (2013.01)

(56) References Cited

U.S. PATENT DOCUMENTS

| | | | |
|---|---|---|---|
| 8,629,005 | B1 | 1/2014 | Minervini |
| 2005/0185812 | A1* | 8/2005 | Minervini ............ B81B 7/0064 381/355 |
| 2008/0289407 | A1 | 11/2008 | Pahl |
| 2011/0156178 | A1 | 6/2011 | Zuniga-Ortiz et al. |
| 2012/0087521 | A1 | 4/2012 | Delaus et al. |
| 2013/0126992 | A1 | 5/2013 | Ehrenpfordt et al. |
| 2013/0322675 | A1 | 12/2013 | Zoellin et al. |
| 2014/0246739 | A1 | 9/2014 | Protheroe et al. |
| 2014/0294209 | A1 | 10/2014 | Szcech et al. |

FOREIGN PATENT DOCUMENTS

| | | |
|---|---|---|
| DE | 102011086764 A1 | 5/2013 |
| EP | 2552124 A1 | 1/2013 |
| JP | 2010219950 | 9/2010 |

OTHER PUBLICATIONS

German Search Report (10 2015 107 557.1) dated Jan. 22, 2016.
International Preliminary Report on Patentability (PCT/EP2016/060479), dated Nov. 14, 2017.

* cited by examiner

US 10,206,046 B2

CIRCUIT BOARD MODULE COMPRISING A CONTINUOUS CAVITY, ASSOCIATED SONIC TRANSDUCER ASSEMBLY, AND PRODUCTION METHOD

CROSS-REFERENCE TO RELATED APPLICATIONS

This application claims priority to International Application Serial No. PCT/EP2016/060479, filed May 10, 2016, which claims priority to German Application No. 10 2015 107 557.1, filed May 13, 2015. International Application Serial No. PCT/EP2016/060479 is hereby incorporated herein in its entirety for all purposes by this reference.

FIELD OF THE INVENTION

The present invention relates to a circuit board module for a sound transducer assembly for generating and/or detecting sound waves in the audible wavelength spectrum with a circuit board, which features a recess with a first opening, and with at least a part of a MEMS sound transducer, which is arranged in the area of the first opening, such that the recess at least partially forms a cavity of the MEMS sound transducer.

Furthermore, the invention relates to a sound transducer assembly with a circuit board module, which comprises a circuit board with a recess featuring a first opening and at least a part of a MEMS sound transducer, whereas such part is arranged in the area of the first opening, such that the recess at least partially forms a cavity of the MEMS transducer, and with a membrane module, which features a membrane frame connected to the circuit board module and at least one membrane held by the membrane frame, whereas the membrane in the extension of the recess is connected to the at least one part of the MEMS sound transducer.

In addition, the invention relates to a method for manufacturing a sound transducer assembly with which a membrane module is connected to a circuit board module, whereas a membrane of the membrane module and an actuator structure of the circuit board module, both of which are deflectable along a common z-axis, are positioned between a press stamp and a reference tool and are pressed between these two, such that the two modules are connected to one another in a first connection area.

BACKGROUND

The term "MEMS" stands for microelectromechanical systems. The term "cavity" is to be understood as an empty space by means of which the sound pressure of the MEMS transducer can be reinforced.

A micromechanical functional device, in particular loudspeaker device, and a corresponding manufacturing method are known from DE 10 2011 084 393 A1. The functional device comprises a substrate, at least one circuit chip mounted on the substrate, a wrapping package in which the circuit chip is packaged, a micromechanical functional assembly, in particular a loudspeaker assembly, with a multiple number of micromechanical loudspeakers mounted on the wrapping package, and a covering device mounted above the micromechanical functional assembly, in particular a loudspeaker assembly, opposite to the wrapping packaging. A major disadvantage of such sound transducer assemblies is that their manufacture is complex and costly. Furthermore, the reject costs are very high, since the sound transducer assembly can be tested only in the fully assembled state and, as a result, in the event of a defect, the entire device is rejected.

Thus, the task of the present invention is to provide a sound transducer assembly and a manufacturing method for such sound transducer assembly, such that manufacturing costs and reject costs can be reduced.

SUMMARY OF THE INVENTION

The task is solved by a circuit board module, a sound transducer assembly, and by a method for manufacturing such a sound transducer assembly, all as described below.

A circuit board module for a sound transducer assembly for generating and/or detecting sound waves in the audible wavelength spectrum is proposed. The circuit board module comprises a circuit board and at least a part of a MEMS sound transducer. Such part of the MEMS sound transducer may be, for example, a MEMS actuator—in particular with a substrate and/or an actuator structure—or a membrane. In a separate production step, such part of the MEMS sound transducer connected to the circuit board module can be connected to another part of the MEMS sound transducer to completely form the MEMS sound transducer.

The circuit board features a recess. The recess comprises a first opening. The part of the MEMS sound transducer is arranged in the area of the first opening. In this manner, the recess at least partially forms a cavity of the MEMS sound transducer. The recess features a second opening opposite to the first opening. As a result, the recess extends completely through the circuit board. Preferably, the recess extends along a z-axis, in the direction of which a membrane provided for this purpose is able to oscillate.

Furthermore, the circuit board module in the area of the second opening comprises a first housing part, which closes off the cavity. Thereby, the circuit board module can be formed as a MEMS speaker.

Due to the at least partially integrative design of the cavity in the circuit board, the proposed circuit board module, in particular in the z-direction, can be formed in a highly installation space-saving manner, since additional components, in particular additional housing parts, can be dimensioned smaller, or even completely spared, for the complete formation of the cavity. Accordingly, the circuit board hollow space or the recess, as the case may be, may be closed off in the area of its second opening by means of a housing part (in particular a plate-shaped housing part), if the volume of the cavity formed by the recess is sufficient for the individual application. Alternatively, however, to increase the performance of the MEMS sound transducer, the volume of the recess may be extended by an additional volume formed in the housing part itself, if a higher sound pressure is required. In this case, the cavity would be formed at least by the closing housing part and the recess. As a result, the cavity of the MEMS sound transducer can be quickly, easily and cost-effectively adapted to the particular application by means of the continuous recess, without having to change the circuit board. Thus, the circuit board module can be expanded in a modular design by various additional components, and can be adapted to different requirements.

An additional advantage of the continuous recess is that the MEMS sound transducer does not have to be connected as a whole to the circuit board in order to be able to test the functionality of its electronic components (in particular, a MEMS actuator and/or an ASIC). Thus, given the continuous recess, parts of the MEMS sound transducer and/or the sound transducer assembly can also be subsequently attached to the circuit board module. For this purpose, the second opening constitutes a mounting opening, through which a mounting tool can be inserted.

Accordingly, for example, only the MEMS actuator—without the membrane—may be connected as part of the MEMS sound transducer to the circuit board or to the ASIC preferably embedded therein, as the case may be. Subsequently, the functionality of such unit or such module, as the case may be, can be tested. If this unit is defective, only the components covered by this unit must be disposed of. The other components of the sound transducer assembly, in particular the membrane, the membrane support and/or additional housing parts, can be spared, whereby reject costs are reduced.

However, if the functional test yields a positive result, the circuit board module may be connected to the other components of the MEMS transducer in a subsequent connection procedure. For this purpose, a reference tool is introduced into the recess through the second opening of the recess. At this, the reference tool is positioned within the recess in such a manner that it holds in position the deflectable and/or movable components of the MEMS sound transducer, in particular the actuator structure and/or the membrane, such that they are not damaged upon pressing from both sides. The reference tool thus acts as a counter-stop. Thus, the second opening is preferably formed as a mounting feed opening for the reference tool.

It is advantageous if the first housing part is flush with the second opening of the recess. Thereby, the cavity ends at the second opening. Thereby, the circuit board module can be formed to be highly compact. Alternatively, however, it is also advantageous if the first housing part features a housing hollow space, which partially forms the cavity. Thereby, the cavity can be extended by the first housing part in addition to the recess with the housing hollow space.

It is advantageous if the circuit board is formed as a frame (in particular, a circumferentially closed frame). It is also advantageous if the circuit board is constructed from several layers. Through a layered structure of the circuit board, electronic components can be easily and cost-effectively integrated or embedded, as the case may be, in the circuit board.

In addition or alternatively, it is advantageous if an ASIC is embedded in the circuit board, in particular in its edge area formed as a frame. Passive additional components are advantageously embedded, alternatively or in addition, in the edge area of the circuit board. At this the frame encloses circumferentially the recess of the circuit board, such that the first opening and the second opening are formed axially relative to the frame. The construction volume of the circuit board can be used as efficiently as possible if the electronic components, in particular an ASIC and/or passive additional components, are embedded in the edge area of the circuit board. Thereby, the circuit board module can be formed to be highly compact.

Furthermore, it is advantageous if that part of the MEMS sound transducer that is connected to the circuit board in the area of the first opening is a MEMS actuator. The MEMS actuator preferably comprises a substrate frame, an actuator structure and/or a coupling element. At this, the substrate frame preferably features a substrate recess. The actuator structure is fastened in particular to the side of the substrate frame turned towards the circuit board. The actuator structure, which preferably comprises at least one cantilever, can be deflected relative to the substrate frame along a z-axis. The actuator structure is preferably formed from at least one piezoelectric layer. The coupling element is arranged in particular in the substrate recess and/or is attached to the actuator structure, in particular at its free end. The substrate frame is preferably made of silicon. If the sound transducer assembly functions as a loudspeaker, the actuator structure can be excited by means of the embedded ASIC in such a manner that a membrane for generating sound energy is set in oscillation by the MEMS actuator. If the sound transducer assembly functions as a microphone, the oscillations are converted into electrical signals by the actuator structure.

It is also advantageous if the width of the recess of the circuit board is less than or equal to the width of the substrate recess. Thereby, the MEMS loudspeaker can be carried by the circuit board, in particular by its edge area formed as a frame. Given the advantageous embodiment, the MEMS actuator can be connected (in particular, glued) to the circuit board in a cost-effective manner. Furthermore, the sound transducer assembly thereby can be formed to be compact, since the outer width of the circuit board can be reduced.

There is an additional advantage if the MEMS actuator is arranged in the direction of the z-axis immediately adjacent to the circuit board. Thereby, the height of the circuit board assembly can be reduced.

The MEMS actuator works together with the membrane provided for this purpose. The actuator structure converts electrical signals into acoustically perceptible sound waves. In order to increase the amplitude of the sound waves, it is therefore advantageous if the MEMS actuator is strongly deflectable in the direction of the z-axis. This can be facilitated if the MEMS actuator is spaced in the direction of the z-axis by means of a spacer from the circuit board. The spacer is preferably formed as an electrical contact, which connects in particular the ASIC to the actuator structure.

A sound transducer assembly for generating and/or detecting sound waves in the audible wavelength spectrum with a circuit board module and a membrane module is also proposed. The circuit board module features a circuit board. The circuit board comprises a recess and at least a part of a MEMS sound transducer, in particular a MEMS actuator. The recess features a first opening. The part of the MEMS sound transducer is arranged in the area of the first opening, such that the recess at least partially forms a cavity of the MEMS sound transducer. The membrane module features a membrane frame and at least one membrane held by the membrane frame. The membrane frame is connected to the circuit board module. The membrane is connected in the extension of the recess with the at least one part of the MEMS sound transducer. The circuit board module is formed in accordance with the preceding description, whereas the specified characteristics can be present individually or in any combination.

The modular structure of the sound transducer assembly makes it possible to, prior to assembly, test the individual modules, in particular the circuit board module and the membrane module, independently of one another for their functionality. The electrical components, such as an ASIC, a MEMS actuator and/or passive additional components, can be checked for their functionality and, if necessary, sorted out in the event of a defect. Advantageously, the sound transducer assembly in accordance with the invention enables the early identification of faulty modules. The number of defective transducer assemblies can be reduced in this manner, by which costs are spared. Likewise, given the continuous circuit board recess, a manufacturing method, with which the sensitive components of the MEMS sound transducer, namely in particular the actuator structure and/or the membrane, are not damaged, can be selected. In the recess, which extends from the second opening to the first opening, a reference tool can thus be introduced through the second opening, which can be positioned in the area of the flexible actuator structure. To connect the MEMS actuator with the membrane, they are pressed together. Thereby, the actuator structure and/or the membrane can be held in position by the reference tool, such that they are not deflected beyond their maximum permissible deflection range. Thus, damage to the actuator structure and/or the membrane can be avoided upon gluing and/or pressing.

Furthermore, it is advantageous if the membrane is connected to an actuator structure of a MEMS actuator in an inner first connection area, in particular indirectly (i.e., through at least one element arranged in between, in particular a coupling element). Through the actuator structure, a lifting movement can be generated, by means of which the membrane is deflected.

It is particularly advantageous if the first connection area is formed between a coupling element of the MEMS actuator arranged on the actuator structure and the membrane, in particular a reinforcing element of the membrane. Through the reinforcing element, the sensitive membrane is protected from damages caused by excessive movement of the membrane due to excessive sound pressure or external vibrations or shock.

It is likewise advantageous if, in an outer second connection area, the membrane frame is connected indirectly and/or directly to the circuit board. Thus, the membrane module is connected to the first connection area formed between the membrane and the coupling element, and to the circuit board module by means of the second connection area formed between the membrane frame and the circuit board. The circuit board formed as a frame, in particular its front side turned towards the membrane module, here serves as a circumferential receiving surface for the membrane frame, such that a stable and secure connection can be established.

Likewise, there are advantages if the sound transducer assembly, in particular the circuit board module, features a first housing part that closes off the cavity. In this connection, it is advantageous if the first housing part partially forms the cavity. Thus, it is possible to customize the sound transducer assembly in accordance with the requirements. The sound pressure and thus the tone that can be generated by a sound transducer assembly is decisively determined by the cavity. In order to improve performance, the cavity can be enlarged as needed by the first housing part. With very limited installation space, it is advantageous if the cavity ends at the second opening. At this, the second opening is preferably closed off by means of the first housing part, such that the size of the cavity from the first opening, starting in the direction of the second opening, is defined solely by the recess. In this case, the first housing part is preferably formed to be flat and/or plate-shaped.

It is advantageous if the first housing part is arranged (in particular glued thereto) on the side of the circuit board turned away from the MEMS sound transducer. Furthermore, it is advantageous if the first housing part preferably encompasses, in a positive-locking manner, the circuit board, in particular in its edge area. The recess of the circuit board can be easily and cost-effectively closed off with the first housing part in the course of the manufacturing process.

In order to be able to avoid an acoustic excitation of the first housing part, it is preferably made of a material that is stiffer compared to the substrate frame and/or the circuit board, in particular a metal, a ceramic and/or a composite material. It is accordingly advantageous if the substrate frame, the circuit board and/or the first housing part are formed from materials that are different from one another.

The substrate frame and/or at least partially the coupling element are preferably made of silicon. The circuit board may be formed from a plastic and/or a fiber composite material.

A method for manufacturing a sound transducer assembly is also proposed. The sound transducer assembly is preferably formed in accordance with the preceding description, whereas the specified characteristics may be present individually or in any combination. With the proposed manufacturing method, a membrane module is connected to a circuit board module. The circuit board module is preferably formed in accordance with the preceding description, whereas the specified characteristics may be present individually or in any combination. With the manufacturing method, a membrane of the membrane module and an actuator structure of the circuit board module are positioned between a press stamp and a reference tool. The two modules, i.e. the membrane module and the circuit board module, are pressed between the press stamp and the reference tool. At this, the membrane module and the circuit board module are connected (in particular, glued) to one another in a first connection area, which is formed between the membrane and the actuator structure. The membrane and the actuator structure are both deflectable along a common z-axis.

Before the two modules are connected to one another, initially, in particular in a separate manufacturing step, the circuit board module is produced, whereas the actuator structure is fastened to a circuit board in the area of a first opening of a recess. Prior to pressing the two modules, the reference tool is inserted into the recess. At this, the reference tool is introduced through a first opening opposite to the second opening in the recess, and is positioned within it. The positioning takes place in such a manner that, upon pressing by the reference tool, the actuator structure and/or the membrane are held in position within a maximum permissible deflection range. This deflection range is defined by the membrane and the actuator structure, and can vary depending on the circumstances. Herein, the materials used in the membrane and/or the actuator structure have significant influence. Through the manufacturing method in accordance with the invention, it can be ensured that the flexible actuator structure and the sensitive membrane are not deflected beyond their respective maximum permissible deflection range in the z-direction, as a result of which they could be damaged. Instead, they are supported by the reference tool in the z-direction. The reference tool thus acts as a stop surface, by means of which the actuator structure and the membrane are held in position during pressing. This also has an advantageous effect on the quality of the sound transducer assembly. The costs of the method for manufacturing a transducer assembly can also be reduced, since only a few work steps are necessary and less rejects are produced.

It is advantageous if the reference tool is inserted so far into the recess until it makes contact with the actuator structure. In this manner, the flexible actuator structure (which is deflectable in particular in the z-direction) can be kept in its neutral position, such that damages that would limit the functionality of the sound transducer cannot occur. Furthermore, the quality of the sound transducer assembly thereby can be improved.

Likewise, it is advantageous if the circuit board module is held in the area of the actuator structure by the reference tool and/or in the area of the circuit board by a holding tool. The reference tool and the holding tool can be formed in one piece or in two pieces. With a two-piece design, it is advantageous if the reference tool is moved relative to the holding tool for insertion into the recess. Accordingly, the holding tool is preferably stationary.

It is advantageous if the circuit board module, in particular with its recess, is placed on the corresponding reference tool and/or is held in position by the holding tool in a positive-locking manner. It is also advantageous if an adhesive is subsequently applied in the first and/or second connection area.

It is also advantageous if the holding tool is partially positioned on the side of the circuit board module turned away from the membrane module, in particular on the circuit board. Alternatively or in addition, the reference tool is positioned in the area of the recess. Thus, in a simple manner and without an expensive special tool, the circuit board module is provided for the connection to the membrane module.

It is advantageous if a gripper engages the membrane module on a membrane frame and/or places it on the circuit board module. In addition or alternatively, the gripper is positioned for connecting in a second connection area on the circuit board module, in particular in the outer area of the circuit board, and/or is pressed with it, in particular in a first and second connection area. In this manner, the membrane module can be positioned on the provided circuit board module. At this, the membrane frame is preferably positioned on the circuit board formed as a frame, such that they are pressed together in the second connection area. At the same time, the membrane is indirectly positioned on the actuator structure, such that the first connection area is formed. As a result of positioning using the holding and reference tool on the one hand and the gripper on the other, the two modules are fixed in such a manner that they can be securely pressed together. The pressing of the two modules can take place simultaneously or sequentially in the two connection areas. In the case of a sequential pressing, it is preferable to initially press the second connection area, preferably in the course of the positioning on the circuit board module, and only then the first connection area.

Furthermore, it is advantageous if the press stamp is displaced in the z-direction relative to the gripper. After the two modules have been correctly positioned, they are pressed together by the force exerted by the press stamp. After the pressing and/or curing of a bonding agent, in particular an adhesive applied in the respective connection area, the press stamp, the gripper and/or the reference tool can be removed from the sound transducer assembly.

There is another advantage if the sound transducer assembly is connected to at least one housing part after pressing and/or connecting the two modules. At this, the circuit board and/or the membrane frame may form a part of the outer housing. Through the housing, the sensitive components of the sound transducer assembly are protected from external influences.

It is advantageous if, after connecting the two modules, the second opening of the recess is closed off with a first housing part. For this purpose, the first housing part is preferably glued to the circuit board at a front side turned away from the membrane module.

BRIEF DESCRIPTION OF THE DRAWINGS

Further advantages of the invention are described in the following embodiments.

The following is shown.

DETAILED DESCRIPTION

In the following description of the figures, in order to define the relationships between the various elements, with reference to the locations of objects shown in the figures, relative terms, such as above, below, up, down, over, under, left, right, vertical and horizontal are used. It is self-evident that such a term may change in the event of a deviation from the location of a device and/or element shown in the figures. Accordingly, for example, in the case of an orientation of a device and/or an element shown inverted with reference to the figures, a characteristic that has been specified as "above" in the following description of the figures would now be arranged "below." Thus, the relative terms are used solely for a more simple description of the relative relationships between the individual devices and/or elements described below.

Figure 1:
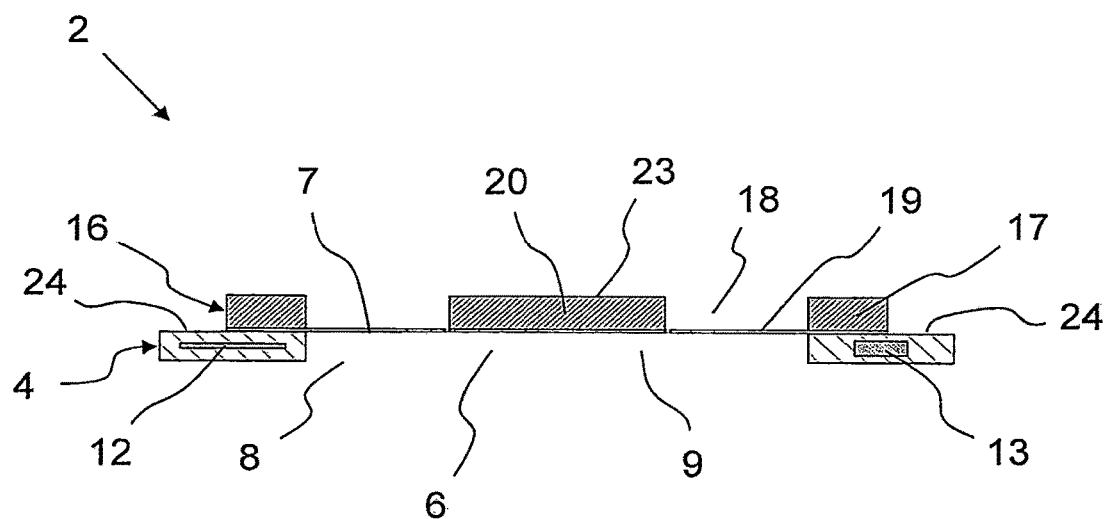
FIG. 1 a circuit board module in a sectional view,
FIG. 2 a membrane module in a sectional view,
FIG. 3 a method for connecting the circuit board module to the membrane module for forming a sound transducer assembly in a connection press,
FIG. 4 a sectional view of the sound transducer assembly manufactured in accordance with the connection press illustrated in FIG. 3,
FIG. 5 a second embodiment of the sound transducer assembly in a perspective view,
FIG. 6 a third embodiment of the sound transducer assembly in a perspective view and
FIG. 7 a fourth embodiment of the sound transducer assembly in a perspective view.

FIG. 1 shows a circuit board module 2 in a sectional view. The circuit board module 2 essentially comprises a circuit board 4 formed as a frame and a part of a MEMS sound transducer 5 (see FIG. 4). In accordance with the present embodiment, this part of the MEMS sound transducer 5 is a MEMS actuator 16. The circuit board 4 features a recess 6 with a first opening 7 turned towards the MEMS actuator 16 and a second opening 8 opposite to the first opening 7. Thus, the recess 6 extends completely through the circuit board 4. It is accordingly a through-hole. The circuit board 4 comprises an ASIC 12 and/or passive additional components 13, which are completely integrated in the circuit board 4. For this purpose, the circuit board 4 is constructed in layers. The circuit board is formed as a circumferentially closed frame, whereas the ASIC 12 and/or the passive additional components 13 are embedded in the frame or edge area, as the case may be.

The MEMS actuator 16 essentially comprises an actuator structure 19, a substrate frame 17 and a coupling element 20. The substrate frame 17 features a substrate recess 18. The coupling element 20 is arranged in the central area of the substrate recess 18. The coupling element 20 is connected to the substrate frame 17 through the (in particular, piezoelectric) actuator structure 19. The coupling element 20 and the substrate frame 17 are made of a silicon substrate and feature the same thickness. The actuator structure 19 is arranged on the side of the substrate frame 17 turned towards the circuit board 4. The MEMS actuator 16, in particular the actuator structure 19, is electrically connected to the circuit board 4, in particular the ASIC 12 and/or the at least one passive additional component 13.

The actuator structure 19 is arranged in the area of the recess 6, in particular the first opening 7. In the present case, the recess 6 is just as wide as the substrate recess 18. The MEMS actuator 16 is connected to the circuit board 4 in the area of the substrate frame 17. The actuator structure 19 can oscillate in the z-direction relative to the substrate frame 17 and the circuit board 4. At this, the coupling element 20 is deflected along the z-axis from the neutral position illustrated here. The recess 6 or the circuit board hollow space, as the case may be, at least partially forms a cavity 9 of the MEMS sound transducer 5, which is completely illustrated in FIG. 4.

The circuit board module 2 illustrated in FIG. 1 features a first connection area 23. This is formed on a side of the coupling element 20 turned away from the actuator 19. Furthermore, the circuit board module 2 features a second connection area 24. This is formed on a front side of the circuit board 4 turned towards the MEMS actuator 16. In the first and second connection area 23, 24, the circuit board module 2 illustrated in FIG. 1 can be connected to a membrane module 3 illustrated in FIG. 2.

Figure 2:
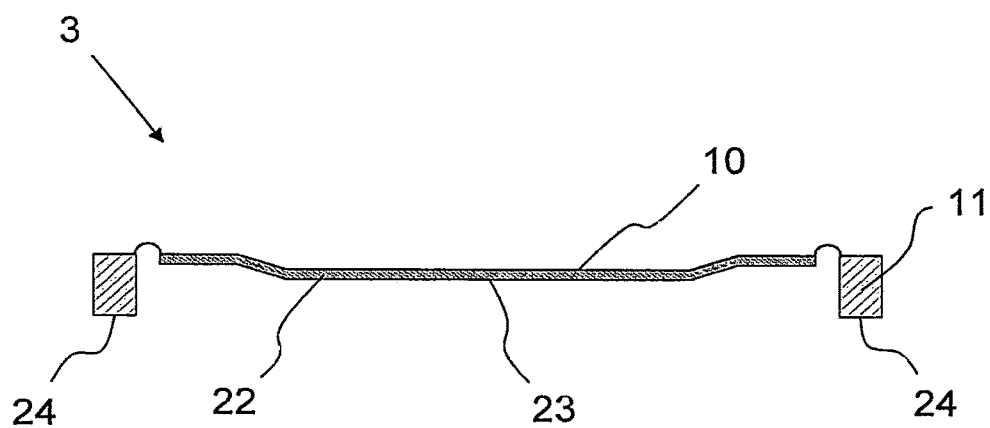

FIG. 2 shows the membrane module 3 in a sectional view, which is provided for the connection to the circuit board module 2 illustrated in FIG. 1. The membrane module 3 comprises a membrane 10. This is accommodated in its edge area in the z-direction in a membrane frame 11 in a oscillating manner. Furthermore, the membrane module 3 comprises a reinforcing element 22 for reinforcing the membrane 10. The reinforcing element 22 is arranged on an underside of the membrane 10. The membrane 10, which is made of rubber, for example, is firmly connected to the membrane frame 11 in its edge area. An elastic area of the membrane 10 is formed between the edge area and the reinforcing element 22. This preferably features a curvature. The reinforcing element 22 itself is not connected to the membrane frame 11 and thus can oscillate in the z-direction relative to it. Thus, the membrane 10 spans the membrane frame 11 and is stiffened in its central area.

In accordance with FIG. 2, the first connection area 23 of the membrane module 3 is formed on the membrane 10 in a middle area. In the present case, the first connection area 23 is formed directly on the reinforcing element 22. In this area, the coupling element 20 illustrated in FIG. 1 is connected to the reinforcing element 22 or indirectly to the membrane 10, as the case may be.

The second connection area 24 of the membrane module 3 is arranged on the front side of the membrane frame 11 in accordance with FIG. 2. Both connection areas 23, 24 are accordingly oriented towards the same side on the front side.

Figure 3:
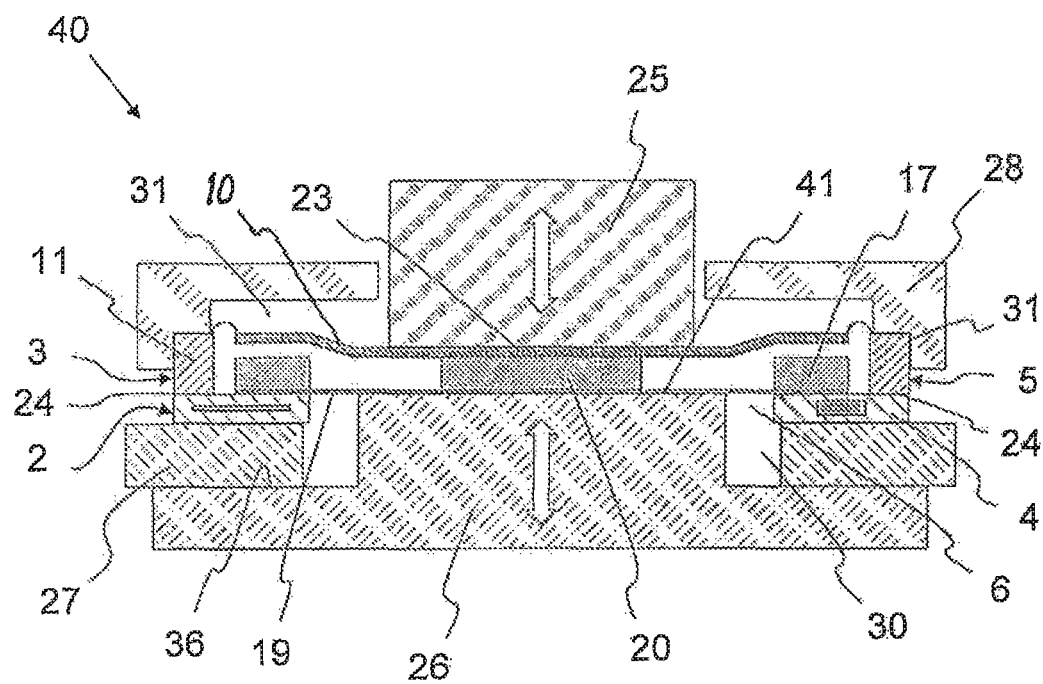
Figure 4:
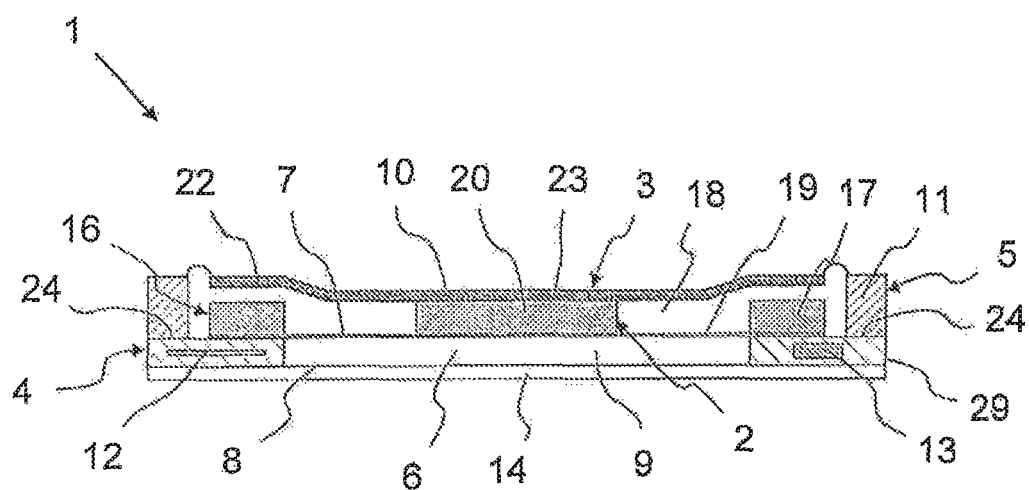

FIG. 3 shows a connection press 40 by means of which the circuit board module 2 illustrated in FIG. 1 can be connected to the membrane module 3 illustrated in FIG. 2, in order to produce a sound transducer assembly 1 illustrated in FIG. 4. Here, the pre-mounted circuit board module 2 is held in position by a holding tool 27. The holding tool 27 makes contact with the the circuit board 4, in particular on the side opposite to the MEMS sound transducer 5. It is also conceivable that the holding tool 27 encompasses, in a positive-locking manner, the circuit board 4, such that any lateral movement of the circuit board module 2 is not possible. The holding tool 27 features a tool recess 30, which, after the positioning of the holding tool 27, is arranged in the area adjacent to the recess 6. Herein, the tool recess 30 forms an extension of the recess 6. The width of the tool recess 30 is greater than, equal to or less the width of the recess 6.

The connection press 40 also includes a reference tool 26. This is narrower than the tool recess 30, such that the reference tool 26 can be inserted in and taken out from the tool recess 30. The reference tool 26 is accordingly axially displaceable along the z-axis relative to the holding tool 27. The reference tool 26 is inserted into the recess 6 of the circuit board 4 prior to being pressed. In accordance with the present embodiment, the reference tool 26 is inserted into the recess 6 until it makes contact with a support surface 41 (in particular, a flat support surface) in the area of the first opening 7 on the MEMS sound transducer 5, in particular on the actuator structure 19 and/or the coupling element 20. Thereby, the axially flexible and/or movable parts of the MEMS sound transducer 5, namely in particular the actuator structure 19, the membrane 10 and/or the coupling element 20 coupling such two elements, are held in position. So that, upon pressing, the actuator structure 19 and the membrane 10 are not damaged due to excessive deflection, the reference tool 26 does not necessarily make contact with the actuator structure 19 in the illustrated neutral position. It may also be spaced from this within the maximum allowable deflection range of the actuator structure 19 and/or the membrane 10. In this case, the actuator structure 19 would thus make contact with the support surface 41 only during pressing. In order to be able to position the reference tool 26 reliably in the desired support position, the reference tool 26 features an axial stop 36. With this, the reference tool 26 touches the holding tool 27 in its supporting end position illustrated in FIG. 3.

The connection press 40 further comprises a gripper 28. The gripper 28 engages the membrane module 3 on its membrane frame 11, in particular on the side of the membrane module 3 featuring the membrane 10, in order to align and position it on the circuit board module 2. The gripper 28 features a gripper recess 31, which is located above the central area of the membrane 10 after the gripping of the membrane module 3, and spaces the gripper 28 from the membrane 10 in the deflectable membrane area.

The two modules 2, 3 are positioned relative to one another by means of the gripper 28 in such a manner that the two modules 2, 3 lie against one another in the first connection area 23 and the second connection area 24. In the first connection area 23, the two parts that can be deflected in the z-direction—namely the membrane 10 and the actuator structure 19—of the MEMS sound transducer 5 are connected to one another. In the illustrated embodiment, the first connection area 23 is formed between the reinforcing element 22 of the membrane module 3 and the coupling element 20 of the circuit board module 2. However, it is also conceivable that the membrane 10 is connected directly to the coupling element 20. Herein, the coupling element 20 may also be formed in multiple parts. In any case, the circuit board module 2 and the membrane module 3 are connected to one another in the first connection area 23, in such a manner that the membrane 10 can be deflected in the z-direction by means of the actuator structure 19 in order to generate sound waves.

In the second connection area 24, the two carrier parts, by means of which the actuator structure 19 or the membrane 10, as the case may be, are accommodated in an oscillating manner—namely, in the present case, the circuit board 4 and the membrane frame 11—of the MEMS sound transducer 5 are connected to one another. Accordingly, in the illustrated embodiment, the frame-like extending second connection area 24 is formed between the membrane frame 11, in particular on its side turned away from the gripper 28, and the outer area of the circuit board 4. Alternatively or in addition, however, the membrane frame 11 could also be fastened to the substrate frame 17 and/or another carrier part of the circuit board module 2. On both modules 2, 3, in particular on the abutting surfaces of the connection areas 23, 24, an adhesive is applied prior to the connection.

After the two modules 2, 3 are arranged together and aligned relative to one another, they are pressed together. In the second connection area 24 the pressing of the two modules 2, 3 takes place between the holding tool 27 and the gripper 28. For pressing the two modules 2, 3 in the first connection area 23, the connection press 40 features a press stamp 25. This is preferably a component of the gripper 28 and/or is displaceable relative to in in the axial direction. For pressing the two modules 2, 3 in the first connection area 23, the press stamp 25 is carried out by the gripper recess 31 until it makes contact with the membrane 10. The press stamp 25 then compresses the two modules 2, 3 in the first connection area 23. At this, the reference tool 26 or its support surface 41 acts as a counter-holder and/or holds the actuator structure 19 and the membrane 10 in position, in particular in its illustrated neutral position. After the pressing and/or curing of the adhesive, the pressing die 25, the gripper 28 and/or the reference tool 26 are moved back again.

FIG. 4 shows a first embodiment of the sound transducer assembly 1 produced according to the described method. In accordance with the method described above, the sound transducer assembly 1 is produced from the circuit board module 2 illustrated in FIG. 1 and the membrane module 3 illustrated in FIG. 2. The sound transducer assembly 1 features a housing 29. In accordance with the present embodiment, this is partially formed from the membrane frame 11 and the circuit board 4. Furthermore, the sound transducer assembly 1 comprises a first housing part 14. This is fastened to the sound transducer assembly 1 after the two modules 2, 3 have been pressed together. The first housing part 14 closes off the recess 6 on the sides of the second opening 8. For this purpose, this is arranged (in particular, glued flush with it) on the side of the circuit board 4 turned away from the MEMS sound transducer 5. As a result, a closed cavity 9 is formed. In the present case, the first housing part 14 is formed to be plate-shaped, and rests flush with the second opening 8. As a result, the cavity 9 in the area of the circuit board 4 and on the side of the circuit board turned away from the MEMS actuator 16 is formed exclusively by the recess 6. The first housing part 14, the substrate frame 17 and/or the circuit board 4 are preferably made from materials that are different from one another.

Figure 5:
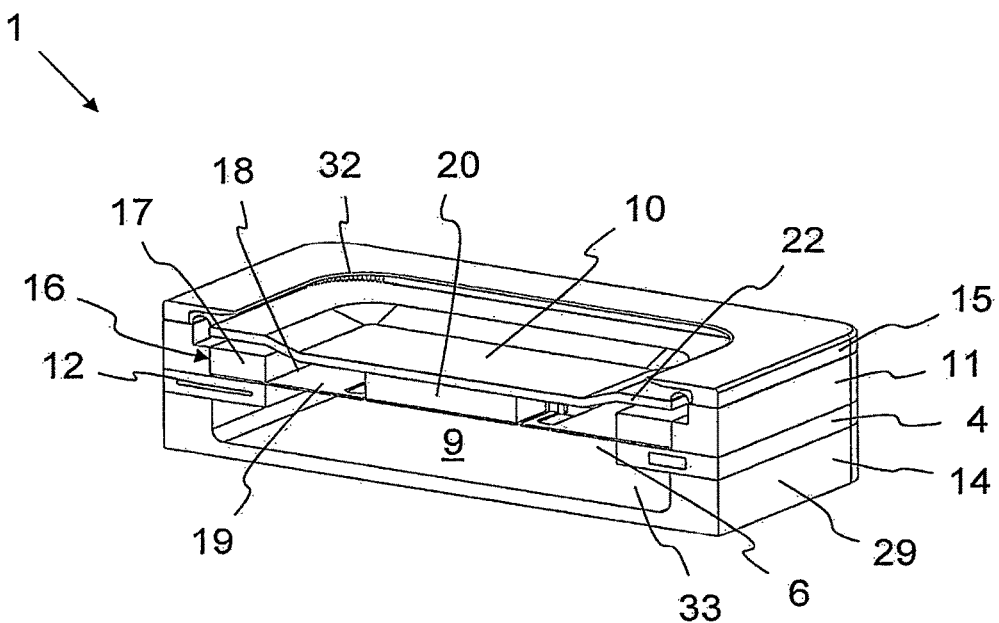
Figure 6:
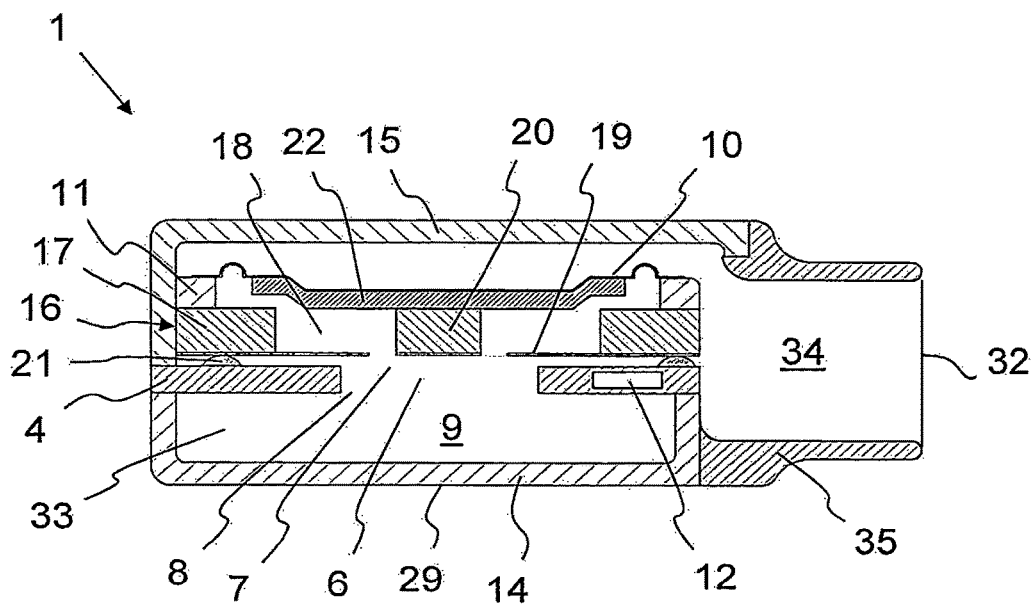
Figure 7:
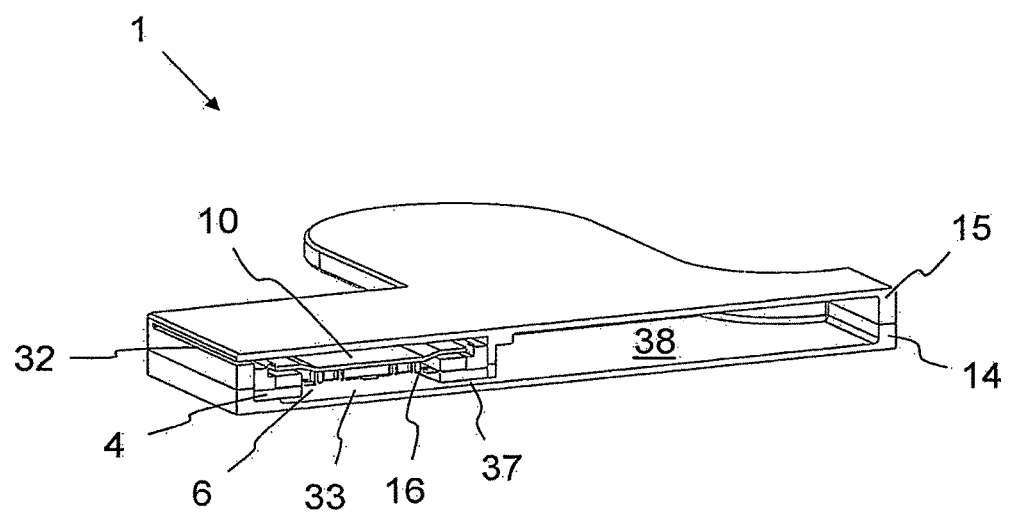

In FIGS. 5 to 7, additional embodiments of the sound transducer assembly 1 are illustrated, whereas, in each case, differences with respect to the first embodiment, as already described, are essentially addressed. Thus, with the following description, the additional embodiments for the same characteristics use the same reference signs. To the extent that these are not explained once again in detail, their design and mode of action correspond to the characteristics described above. The differences described below can be combined with the characteristics of the respective preceding and subsequent embodiments.

FIG. 5 shows a second embodiment of the sound transducer assembly 1 in a perspective view. Here, the housing 29 is likewise formed by the membrane frame 11, the circuit board 4 and the first housing part 14. In addition, however, the housing 29 comprises a second housing part 15. The second housing part 15 is arranged on the side of the MEMS sound transducer 5 turned away from the circuit board 4. Thus, the membrane 10 is glued between the membrane frame 11 and the second housing part 15. The second housing part 15 features a sound outlet opening 32. Through this, the sound waves, which arise as a result of the excitation of the membrane 10 by the actuator structure 19, emerge from the housing 29. In accordance with the present embodiment, the sound outlet opening 32 is arranged above the central area of the membrane 10. The second housing part 15 protects the elastic area of the membrane 10, which is not reinforced by the reinforcing element 22.

The first housing part 14 is fastened to the front side of the circuit board 4. In an embodiment not illustrated here, the first housing part 14 encompasses, in a positive-locking manner, the circuit board 4, but also in its outer edge area. In contrast to the embodiment illustrated in FIG. 4, the first housing part 14 features a housing hollow space 33. This forms the cavity 9 in addition to the recess 6.

FIG. 6 shows a third embodiment of the sound transducer assembly 1. Here, the first housing part 14 likewise forms part of the cavity 9 of the MEMS sound transducer 5 by means of the housing hollow space 33. The housing hollow space 33 directly adjoins the recess 6 of the circuit board 4 in the area of the second opening 8.

In the present case, the second housing part 15 partially forms a sound-conducting channel 34. An additional part of the sound-conducting channel 34 is formed by a third housing part 35. Here, the sound outlet opening 32 is formed on the third housing part 35. The third housing part 35 is attached on the side at the first and second housing parts 14, 15. Accordingly, the generated sound waves are guided from the membrane 10, starting through the sound-conducting channel 34 formed in the second and third housing part 15, 35, to the sound outlet opening 32, and through this out of the housing 29 of the sound transducer assembly 1.

In accordance with the embodiment illustrated in FIG. 6, the recess 6 is formed to be narrower than the substrate recess 18. In order to be able to avoid the limitation of the maximum deflectability of the actuator structure 19 in the z-direction, the actuator structure 19 is spaced from the first opening 7 or from the circuit board 4, as the case may be. For this purpose, the sound transducer assembly 1 features a spacer 21. The spacer 21 is preferably formed as an electrical contact. It electrically connects the ASIC 12 to the actuator structure 19 of the MEMS sound transducer 5. The spacer 21 is arranged between the circuit board 4 and the MEMS actuator 16, in particular its actuator structure 19. In this manner, the MEMS actuator 16 is spaced from the circuit board 4 in the z-direction, and thus does not abut the circuit board 4 upon its deflection.

FIG. 7 shows a fourth embodiment of the sound transducer assembly 1. Herein, the cavity 9 of the MEMS sound transducer 5 is formed by the recess 6 of the circuit board 4, the housing hollow space 33 and an additional volume 38. The additional volume 38 and the housing hollow space 33 are connected to one another through a connecting channel 37. The housing of the additional volume 38 is formed by a first and a second housing part 14, 15.

This invention is not limited to the illustrated and described embodiments. Variations within the scope of the claims, just as the combination of characteristics, are possible, even if they are illustrated and described in different embodiments.

LIST OF REFERENCE SIGNS

1 Sound transducer assembly
2 Circuit board module
3 Membrane module
4 Circuit board
5 MEMS sound transducer
6 Recess
7 First opening
8 Second opening
9 Cavity
10 Membrane 11 Membrane frame
12 ASIC
13 Passive additional components
14 First housing part
15 Second housing part
16 MEMS actuator
17 Substrate frame
18 Substrate recess
19 Actuator structure
20 Coupling element
21 Spacer
22 Reinforcing element
23 First connecting area
24 Second connecting area
25 Press stamp
26 Reference tool
27 Holding tool
28 Gripper
29 Housing
30 Tool recess
31 Gripper recess
32 Sound outlet opening
33 Housing hollow space
34 Sound-conducting channel
35 Third housing part
36 Axial stop
37 Connecting channel
38 Additional volume
39 Volume housing
40 Connection press
41 Support surface

The invention claimed is:

1. Method for manufacturing a sound transducer assembly that includes a circuit board module with a circuit board and an actuator structure deflectable along a Z-axis and fastened to the circuit board in the area of a first opening of a recess, the sound transducer assembly having a membrane module with a membrane deflectable along the Z-axis, the method comprising the steps of:
positioning the membrane of the membrane module and the actuator structure of the circuit board module between a press stamp and a reference tool;
inserting the reference tool into the recess through a second opening that is disposed opposite to the first opening;
positioning the reference tool within the recess in such a manner that at least one of the actuator structure and the membrane is held in position upon pressing by the reference tool; and
pressing the membrane and the actuator structure between the press stamp and the reference tool such that the two modules are connected to one another in a first connection area.

2. Method according to claim 1, wherein the reference tool is inserted so far into the recess until it makes contact with the actuator structure.

3. Method according to claim 1, wherein the circuit board module is held in the area of the actuator structure by the reference tool and/or in the area of the circuit board by a holding tool, whereas the reference tool is preferably moved relative to the holding tool.

4. Method according to claim 1, wherein the holding tool is partially positioned on the side of the circuit board module turned away from the membrane module, in particular on the circuit board, and/or the reference tool is positioned in the area of the recess.

5. Method according to claim 1, wherein a gripper engages the membrane module on a membrane frame and/or is positioned for connecting in a second connection area on the circuit board module, in particular in the outer area of the circuit board, and/or is pressed with it.

6. Method according to claim 1, wherein, for the pressing of the first connection area, the press stamp is displaced relative to the gripper and/or to the reference tool.

7. Method according to claim 1, wherein, after pressing, the sound transducer assembly is connected to a housing part closing off the cavity.

8. A sound transducer assembly for generating and/or detecting sound waves in the audible wavelength spectrum, comprising:
a circuit board with a recess having a first opening, wherein the recess of the circuit board includes a second opening disposed opposite to the first opening such that the recess of the circuit board extends completely through the circuit board between the first and second openings;
a MEMS sound transducer having a section disposed in the area of the first opening such that the recess of the circuit board at least partially forms a cavity of the MEMS sound transducer;
a first housing part that closes off the cavity in the area of the second opening;
a substrate frame, a coupling element, and an actuator structure, wherein the actuator structure is fastened to the coupling element and to the substrate frame, wherein the actuator structure is deflectable along a z-axis relative to the substrate frame, and wherein the substrate frame defines a substrate recess; and
a membrane frame, a membrane held by the membrane frame, wherein a portion of the membrane that extends in the area of the substrate recess is connected to the section of the MEMS sound transducer; and
wherein the membrane defines an inner first connection area, wherein the coupling element is disposed on the actuator structure and between the inner first connection area of the membrane and the actuator structure.

9. The sound transducer assembly according to claim 8, wherein the membrane frame defines an outer second connection area that is connected indirectly to the circuit board.

10. The sound transducer assembly according to claim 9, wherein the first housing part is flush with the second opening of the recess.

11. The sound transducer assembly according to claim 9, wherein the first housing part includes a housing hollow space that partially forms the cavity.

12. The sound transducer assembly according to claim 8, wherein the membrane frame defines an outer second connection area that is connected directly to the circuit board.

13. The sound transducer assembly according to claim 12, wherein the first housing part is flush with the second opening of the recess.

14. The sound transducer assembly according to claim 12, wherein the first housing part includes a housing hollow space that partially forms the cavity.

15. The sound transducer assembly according to claim 8, wherein the circuit board is formed as a frame constructed from several layers.

16. The sound transducer assembly according to claim 8, wherein the circuit board is formed as a frame with an edge area that is embedded with an ASIC.

17. The sound transducer assembly according to claim 8, wherein the circuit board is formed as a frame with an edge area that is embedded with passive electric components.

18. The sound transducer assembly according to claim 8, wherein the MEMS actuator is disposed in the direction of the Z-axis immediately adjacent to the circuit board.

19. The sound transducer assembly according to claim 8, wherein a spacer, which is formed as an electrical contact, is disposed to space the MEMS actuator from the circuit board in the direction of the Z-axis.

20. A sound transducer assembly for generating and/or detecting sound waves in the audible wavelength spectrum, comprising:
   a circuit board module including a circuit board with a recess having a first opening, wherein the recess of the circuit board includes a second opening disposed opposite to the first opening such that the recess of the circuit board extends completely through the circuit board between the first and second openings;
   the circuit board module further including a MEMS sound transducer having a part disposed in the area of the first opening such that the recess of the circuit board at least partially forms a cavity of the MEMS sound transducer, and the circuit board module further includes a first housing part that closes off the cavity in the area of the second opening;
   a MEMS actuator, which includes a substrate frame, a coupling element, and an actuator structure, wherein the actuator structure is fastened to the coupling element and to the substrate frame, wherein the actuator structure is deflectable along a z-axis relative to the substrate frame, and wherein the substrate frame defines a substrate recess; and
   a membrane module that includes a membrane frame connected to the circuit board module, and the membrane module further includes at least one membrane held by the membrane frame, wherein a portion of the membrane that extends in the area of the substrate recess is connected to the part of the MEMS sound transducer; and
   wherein the membrane defines an inner first connection area, wherein the coupling element of the MEMS actuator is disposed on the actuator structure and between the inner first connection area of the membrane and the actuator structure.

* * * * *